United States Patent
Jang et al.

(10) Patent No.: US 8,429,509 B2
(45) Date of Patent: Apr. 23, 2013

(54) APPARATUS AND METHOD FOR DETERMINING RELIABILITY OF DECODED DATA IN COMMUNICATION SYSTEM

(75) Inventors: Min-Ho Jang, Seoul (KR); Hwa-Sun You, Suwon-si (KR); Hee-Won Kang, Seongnam-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 285 days.

(21) Appl. No.: 13/004,574

(22) Filed: Jan. 11, 2011

(65) Prior Publication Data
US 2011/0173518 A1 Jul. 14, 2011

(30) Foreign Application Priority Data

Jan. 11, 2010 (KR) .......................... 10-2010-0002222

(51) Int. Cl.
*H03M 13/00* (2006.01)
(52) U.S. Cl.
USPC .......................................................... 714/780

(58) Field of Classification Search .................. 714/758, 714/780, 786, 794–796; 375/260, 340
See application file for complete search history.

(56) References Cited

U.S. PATENT DOCUMENTS

| | | | | |
|---|---|---|---|---|
| 7,636,399 | B2* | 12/2009 | Brown et al. | 375/260 |
| 8,015,499 | B2* | 9/2011 | Kanaoka | 715/780 |
| 8,050,362 | B2* | 11/2011 | Gho et al. | 375/340 |
| 2009/0327836 | A1* | 12/2009 | Shimizu | 714/758 |

* cited by examiner

*Primary Examiner* — Shelly A Chase

(57) ABSTRACT

A method and apparatus for determining the reliability of decoded data in a communication system. The method includes calculating a total sum of absolute values corresponding to Log Likelihood Ratio (LLR) values of received data, generating a first value obtained by multiplying the total sum of the absolute values by a predetermined threshold value, performing iterative decoding with respect to the LLR values of the received data, generating a survived path metric value having a maximum value among all path metric values as a decoded result and generating decoded data, comparing the first value with the survived path metric value, and determining whether the decoded data has suitable reliability according to the compared result.

20 Claims, 4 Drawing Sheets

APPARATUS AND METHOD FOR DETERMINING RELIABILITY OF DECODED DATA IN COMMUNICATION SYSTEM

CROSS-REFERENCE TO RELATED APPLICATION(S) AND CLAIM OF PRIORITY

The present application is related to and claims the benefit under 35 U.S.C. §119(a) of a Korean Patent Application filed in the Korean Intellectual Property Office on Jan. 11, 2010 and assigned Serial No. 10-2010-0002222, the entire disclosure of which is hereby incorporated by reference.

TECHNICAL FIELD OF THE INVENTION

The present invention relates generally to an apparatus and method for determining the reliability of decoded data in a communication system.

BACKGROUND OF THE INVENTION

As a high-speed, large-capacity communication system is demanded in a future generation communication system, an increase in the transmission efficiency of a system using a proper channel encoding scheme is an indispensable factor to improve system performance. However, a mobile communication system may generate errors caused by noise, interference and fading according to a channel environment during data transmission, thereby losing information data.

To reduce the loss of information data caused by the occurrence of an error, a variety of error correcting coding schemes are used according to the characteristics of channels, and thus the reliability of the mobile communication system can be improved. Error correction codes used for the error correction coding schemes may be broadly classified into two types according to a channel code generation method. That is, the error correction codes may be divided into codes generated by an algebraic method, such as Bose Chaudhuri Hocquenghem (BCH) codes and Reed Solomon (RS) codes, and codes having a tree structure of a bipartite graph form, such as convolutional codes, turbo codes and Low Density Parity Check (LDPC) codes. The codes having the tree structure have been used in many systems because they are very suitable for real-time decoding of high-capacity and high-speed data due to a relatively simple structure and excellent performance of an iterative decoding algorithm.

In particular, a Tail Biting Convolutional Code (TBCC) has been adopted as standard in many communication systems due to a simple structure and superior error correction performance and has attracted attention as an error correction code for a control channel in a recent standardization process of the Institute of Electrical and Electronics Engineers (IEEE) 802.16m.

A Secondary Fast feedBack Channel (S-FBCH), which is an uplink control channel, is used in the IEEE 802.16m standard. However, the S-FBCH has problems of inability to allocate bits for an additional Cyclic Redundancy Check (CRC) in a system because fewer resources are allocated thereto. Further, in situations where the presence/absence of signals should be determined according to a BandWidth REQuest Channel (BW-REQCH), there are no methods for efficiently determining the presence/absence of signals. Therefore, techniques for checking the reliability of decoded data for those channels are needed.

SUMMARY OF THE INVENTION

To address the above-discussed deficiencies of the prior art, it is a primary object to provide an apparatus and method for determining the reliability of TBCC decoded data in a communication system.

In accordance with an embodiment of the present invention, an apparatus for determining the reliability of decoded data in a communication system includes a summer configured to calculate a total sum of absolute values corresponding to Log Likelihood Ratio (LLR) values of received data. The apparatus also includes a multiplier configured to generate a first value obtained by multiplying the total sum of the absolute values by a predetermined threshold value. The apparatus also includes an iterative decoder configured to perform iterative decoding with respect to the LLR values of the received data, generate a survived path metric value having a maximum value among all path metric values as a decoded result, and generate decoded data. The apparatus further includes a comparator configured to compare the first value with the survived path metric value, and a selector configured to determine whether the decoded data has suitable reliability according to the compared result.

In accordance with another embodiment of the present invention, a method for determining the reliability of decoded data in a communication system includes calculating a total sum of absolute values corresponding to Log Likelihood Ratio (LLR) values of received data. The method also includes generating a first value obtained by multiplying the total sum of the absolute values by a predetermined threshold value. The method also includes performing iterative decoding with respect to the LLR values of the received data, generating a survived path metric value having a maximum value among all path metric values as a decoded result and generating decoded data. The method further includes comparing the first value with the survived path metric value, and determining whether the decoded data has suitable reliability according to the compared result.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system. The following detailed description includes specific details in order to provide a thorough understanding of the present invention. However, it will be apparent to those skilled in the art that the present invention may be practiced without such specific details.

An operation for determining the reliability of TBCC decoded data in a communication will be described hereinbelow in detail. In the following description, an IEEE 802.16m system standard is used as an example to describe exemplary embodiments of the present invention. However, a reliability test of a TBCC decoding apparatus according to the present invention is not limited to such a specific system standard.

Figure 1:
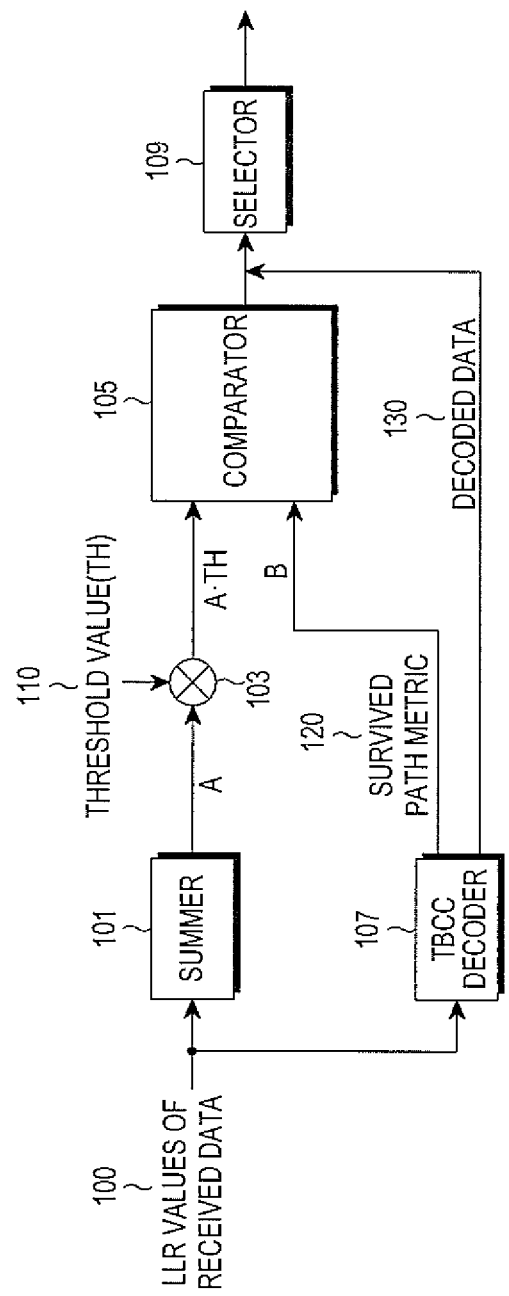
FIG. 1 illustrates an apparatus for determining the reliability of TBCC decoded data in a communication system.

FIG. 1 is a diagram illustrating an apparatus for determining the reliability of TBCC decoded data in a communication system.

Referring to FIG. 1, a TBCC decoding apparatus includes a summer 101, a multiplier 103, a comparator 105, a TBCC decoder 107, and a selector 109.

Log Likelihood Ratio (LLR) values 100 of received data are input to the summer 101 and the TBCC decoder 107. The TBCC decoder 107 decodes the LLR values into original data through a Soft Output Viterbi Algorithm (SOVA). A decoding operation according to the SOVA is as follows. First, branch metrics are calculated using the LLR values with respect to all branches and all path metrics are calculated from the respective branches. A maximum path metric, that is, a survived path metric having a maximum value among the calculated path metric values, is selected and stored. Data is decoded by traceback of the survived path metric.

Accordingly, the TBCC decoder 107 generates a survived path metric value 120 selected through the SOVA and decoded data 130.

The summer 101 calculates a total sum A of absolute values of the input LLR values through the following Equation 1.

$$A = \Sigma_k |LLR[k]|$$ [Eqn. 1]

where k denotes an index of a bit to be decoded.

Next, the summer 101 provides the total sum A of the absolute values of the LLR values to the multiplier 103. The multiplier 103 multiplies the total sum A of the absolute values of the LLR values by a predetermined threshold value TH 110. The multiplied value is supplied to the comparator 105.

The comparator 105 receives the product A·TH of the total sum A of the absolute values of the LLR values and the predetermined threshold value TH and receives the survived path metric value 120, that is, B. The comparator compares the product A·TH with the value B and supplies the compared result to the selector 109. The threshold value TH is an exemplary value and may be experimentally determined according to references demanded in a reliability test or a rate erasing decoded data.

The selector 109 receives the compared result and the decoded data 130. If the product A·TH is equal to or greater than the value B, the selector 109 determines that the reliability of the decoded data 130 is remarkably low and erases the decoded data 130. However, if the product A·TH is less than the value B, the selector 109 determines that the reliability of the decoded data 130 is high and selects and generates the decoded data 130.

Thus, since the TBCC decoding apparatus shown in FIG. 1 fundamentally disregards received data having low reliability or determines that the received data having low reliability is not present, it can prevent an error rate generated during data decoding from being raised and can ensure the reliability of data decoding.

Figure 2:
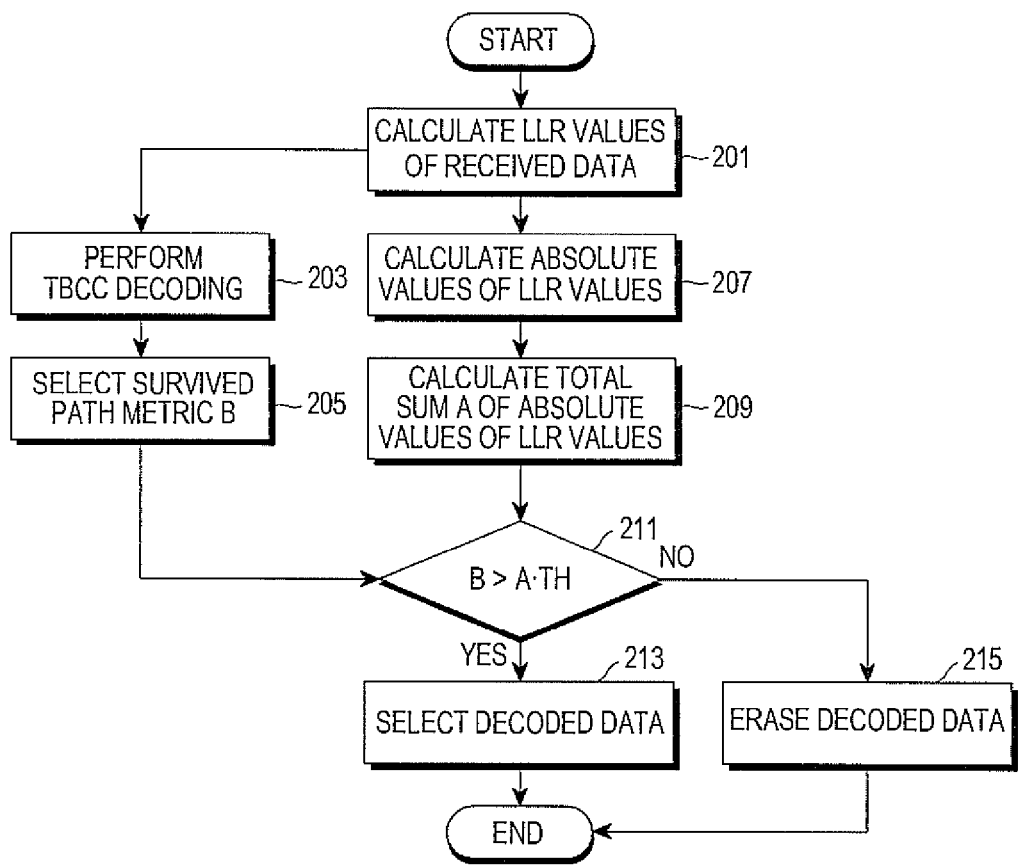
FIG. 2 illustrates a process for determining the reliability of TBCC decoded data in a communication system.

FIG. 2 is a flow chart illustrating a process for determining the reliability of TBCC decoded data in a communication system.

Referring to FIG. 2, the TBCC decoding apparatus calculates LLR values of received data in block 201 and proceeds to blocks 203 and 207. The received data may be data of an S-FBCH or data of a BW-REQCH. The TBCC decoding apparatus calculates absolute values of the LLR values in block 207 and calculates the total sum of the absolute values of the LLR values in block 209.

The TBCC decoding apparatus performs, in block 203, TBCC decoding for the LLR values calculated in block 201. The TBCC decoding apparatus selects a survived path metric calculated in a TBCC decoding process in block 205. The TBCC decoding apparatus compares, in block 211, the product A·TH of the total sum A of the absolute values of the LLR values and the threshold value TH with the survived path metric value B selected in block 205. If the value A·TH is less than the value B, the TBCC decoding apparatus determines that the reliability of decoded data is high and selects the decoded data in block 213.

If the value A·TH is equal to or greater than the value B, the TBCC decoding apparatus determines that the reliability of the decoded is remarkably low and erases the decoded data in block 215.

Figure 3:
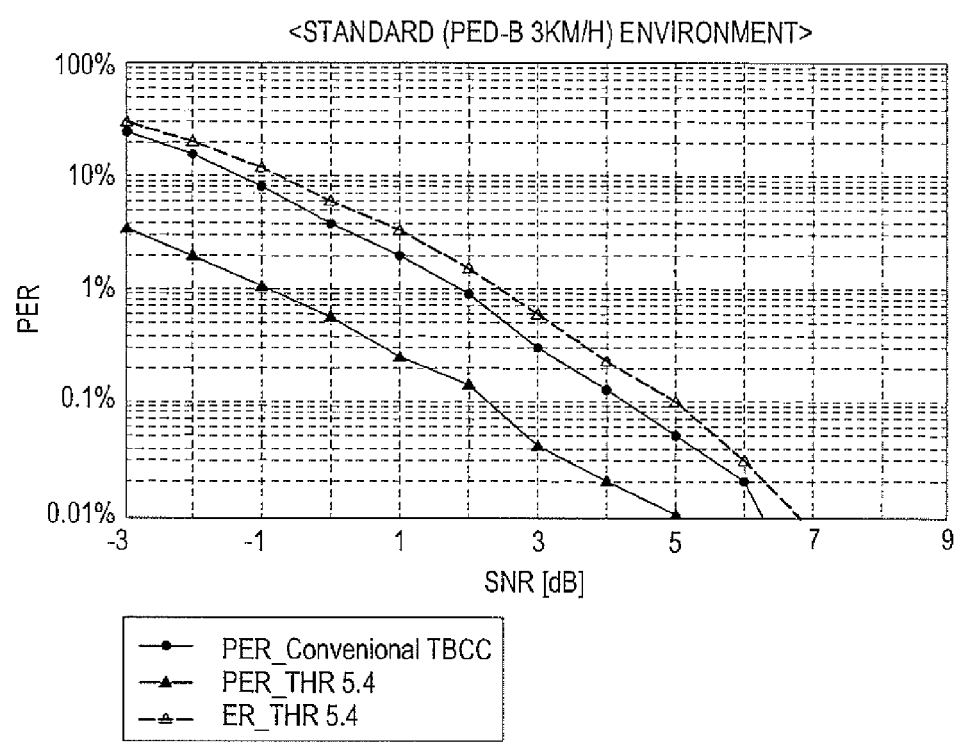
FIG. 3 illustrates packet error rates (PERs) in a standard environment according to Signal-to-Noise Ratios (SNRs) of a general TBCC decoder and a TBCC decoding apparatus newly proposed in an embodiment of the present invention.

FIG. 3 is a graph illustrating packet error rates (PERs) in a standard environment according to Signal-to-Noise Ratios (SNRs) of a general TBCC decoder and a TBCC decoding apparatus newly proposed in an embodiment of the present invention.

The standard environment refers to an environment defined in, for example, an IEEE 802.16 system standard and it is assumed that a pedestrian moves at a speed of 3 km/h. In this situation, an optimal threshold value, PER, and Erasure Rate (ER) erasing decoded data, which are predetermined for simulation, are 5.4, 1%, and 10%, respectively.

Referring to FIG. 3, a PER PER_Conventional TBCC according to an SNR of a general TBCC decoder and a PER PER_THR5.4 according to an SNR of a TBCC decoding apparatus newly proposed in an embodiment of the present invention are shown in the above-described standard environment. As shown, it can be appreciated that a PER of the general TBCC decoder has a much higher value than a PER of the proposed TBCC decoding apparatus at the same SNR. For example, when an SNR is −3 dB, a PER of the general TBCC decoder greatly exceeds 10% but a PER of the TBCC decoding apparatus proposed in the embodiment of the present invention is about 5%. Moreover, in the standard environment, it can be understood that the TBCC decoding apparatus proposed in the embodiment of the present invention has an increased width of performance improvement when a channel environment is not good, that is, as an SNR is low.

Figure 4:
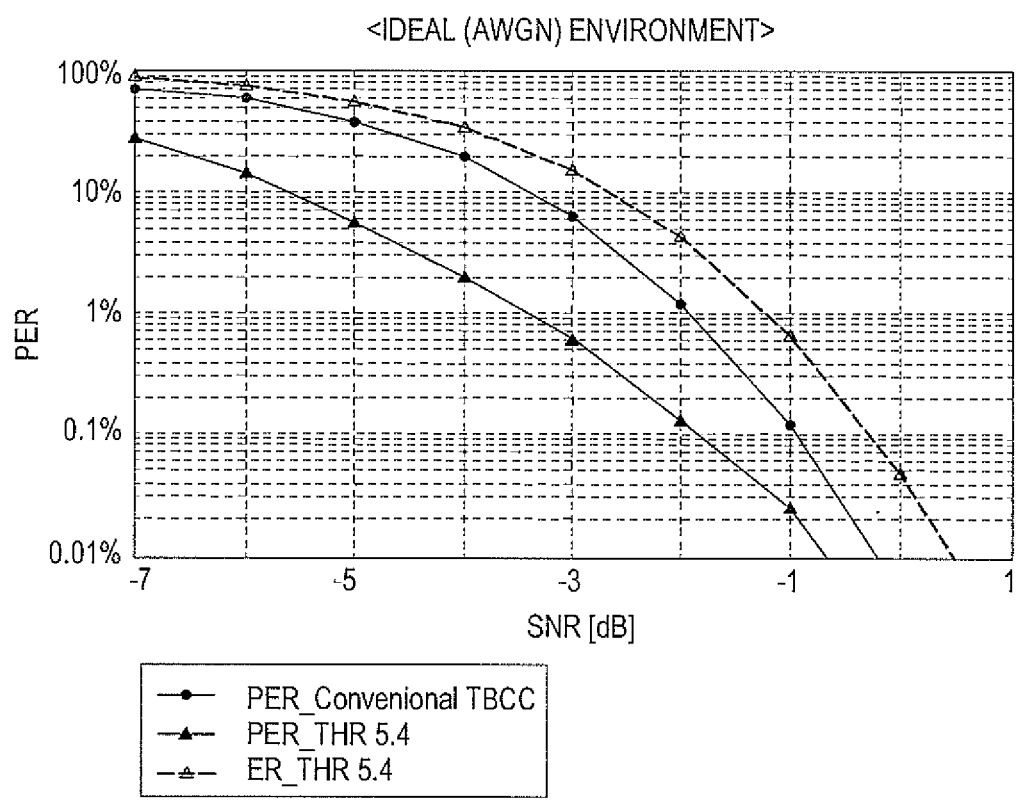
FIG. 4 illustrates PERs in an ideal environment according to SNRs of a general TBCC decoder and a TBCC decoding apparatus newly proposed in an embodiment of the present invention.

FIG. 4 is a graph illustrating PERs in an ideal environment according to SNRs of a general TBCC decoder and a TBCC decoding apparatus newly proposed in an embodiment of the present invention.

It is assumed that the ideal environment is, for example, an Additive White Gaussian Noise (AWGN) environment. In this situation, an optimal threshold value, PER, and Erasure Rate (ER), which are predetermined for simulation, are 5.4, 1%, and 10%, respectively.

Referring to FIG. 4, a PER PER_Conventional TBCC according to an SNR of a general TBCC decoder and a PER PER_THR5.4 according to an SNR of a TBCC decoding apparatus newly proposed in an embodiment of the present invention are shown in the above-described ideal environment. As shown, it can be appreciated that a PER of the general TBCC decoder has a much higher value than a PER of the proposed TBCC decoding apparatus at the same SNR. For example, when an SNR is −3 dB, a PER of the general TBCC decoder approximates to 10% but a PER of the TBCC decoding apparatus proposed in the embodiment of the present invention is less than 1%. Moreover, it can be understood in the above-described ideal environment that the TBCC decoding apparatus proposed in the embodiment of the present invention shows less performance improvement according to a variation of a channel environment with respect to the standard environment shown in FIG. 3, that is, according to a variation of an SNR.

According to the embodiment of the present invention, whether decoded data has suitable reliability can be determined using a survived path metric value calculated in a TBCC decoding process, in an S-FBCH to which additional CRC bits cannot be allocated by a system due to few allocation resources, or in a BW-REQCH which should determine the presence/absence of received signals, thereby ensuring the reliability of data decoding without an increase of complexity of a system compared with a conventional TBCC decoder.

Further, a method for determining the reliability of decoded data proposed in the embodiment of the present invention can be applied to all channel codes supporting iterative decoding as well as decoding of a TBCC decoder, that is, to convolutional codes, turbo codes, LDPC codes, and the like.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for determining the reliability of decoded data in a communication system, comprising:
   calculating a total sum of absolute values corresponding to Log Likelihood Ratio (LLR) values of received data;
   generating a first value obtained by multiplying the total sum of the absolute values by a predetermined threshold value;
   performing iterative decoding with respect to the LLR values of the received data, generating a survived path metric value having a maximum value among all path metric values as a decoded result, and generating decoded data;
   comparing the first value with the survived path metric value; and
   determining whether the decoded data has suitable reliability according to the compared result.

2. The method of claim 1, wherein determining whether the decoded data has suitable reliability comprises determining that the reliability of the decoded data is high when the first value is less than the survived path metric value, and selecting and generating the decoded data.

3. The method of claim 1, wherein determining whether the decoded data has suitable reliability comprises determining that the reliability of the decoded data is low when the first value is equal to or greater than the survived metric value, and erasing the decoded data.

4. The method of claim 1, wherein the received data is data received through a channel that does not use a Cyclic Redundancy Check (CRC) scheme.

5. The method of claim 1, wherein the received data is data received through a channel that determines whether the received data is present.

6. The method of claim 1, wherein the iterative decoding is performed by a Tail Biting Convolutional Code (TBCC) decoder.

7. The method of claim 1, wherein the received data comprises data associated with a secondary fast feedback channel (S-FBCH) or data associated with a bandwidth request channel (BW-REQCH).

8. An apparatus for determining the reliability of decoded data in a communication system, comprising:
   a summer configured to calculate a total sum of absolute values corresponding to Log Likelihood Ratio (LLR) values of received data;
   a multiplier configured to generate a first value obtained by multiplying the total sum of the absolute values by a predetermined threshold value;
   an iterative decoder configured to perform iterative decoding with respect to the LLR values of the received data, generate a survived path metric value having a maximum value among all path metric values as a decoded result, and generate decoded data;
   a comparator configured to compare the first value with the survived path metric value; and
   a selector configured to determine whether the decoded data has suitable reliability according to the compared result.

9. The apparatus of claim 8, wherein the selector determines that the reliability of the decoded data is high when the first value is less than the survived path metric value, and selects and generates the decoded data.

10. The apparatus of claim 8, wherein the selector determines that the reliability of the decoded data is low when the first value is equal to or greater than the survived metric value, and erases the decoded data.

11. The apparatus of claim 8, wherein the received data is data received through a channel that does not use a Cyclic Redundancy Check (CRC) scheme.

12. The apparatus of claim 8, wherein the received data is data received through a channel that determines whether the received data is present.

13. The apparatus of claim 8, wherein the iterative decoder comprises a Tail Biting Convolutional Code (TBCC) decoder.

14. The apparatus of claim 8, wherein the received data comprises data associated with a secondary fast feedback channel (S-FBCH) or data associated with a bandwidth request channel (BW-REQCH).

15. A communication system, comprising:
   one or more apparatuses for determining the reliability of decoded data in the communication system, each of the one or more apparatuses comprising:
      a summer configured to calculate a total sum of absolute values corresponding to Log Likelihood Ratio (LLR) values of received data;
      a multiplier configured to generate a first value obtained by multiplying the total sum of the absolute values by a predetermined threshold value;
      an iterative decoder configured to perform iterative decoding with respect to the LLR values of the received data, generate a survived path metric value having a maximum value among all path metric values as a decoded result, and generate decoded data;
      a comparator configured to compare the first value with the survived path metric value; and
      a selector configured to determine whether the decoded data has suitable reliability according to the compared result.

16. The communication system of claim 15, wherein the selector determines that the reliability of the decoded data is high when the first value is less than the survived path metric value, and selects and generates the decoded data.

17. The communication system of claim 15, wherein the selector determines that the reliability of the decoded data is low when the first value is equal to or greater than the survived metric value, and erases the decoded data.

18. The communication system of claim 15, wherein the received data is data received through a channel that does not use a Cyclic Redundancy Check (CRC) scheme.

19. The communication system of claim 15, wherein the received data is data received through a channel that determines whether the received data is present.

20. The communication system of claim 15, wherein the iterative decoder comprises a Tail Biting Convolutional Code (TBCC) decoder.

* * * * *